United States Patent
Koshimizu

[11] Patent Number: 6,101,970
[45] Date of Patent: Aug. 15, 2000

[54] PLASMA PROCESSING APPARATUS

[75] Inventor: Chishio Koshimizu, Yamanashi-ken, Japan

[73] Assignees: Tokyo Electron Yamanashi Limited, Nirasaki; Japan Science and Technology Corporation, Kawaguchi, both of Japan

[21] Appl. No.: 09/162,452

[22] Filed: Sep. 29, 1998

[30] Foreign Application Priority Data

Sep. 30, 1997 [JP] Japan .................................... 9-284378

[51] Int. Cl.[7] ................................................ C23C 16/509
[52] U.S. Cl. .................................... 118/723 E; 118/723 I; 118/723 AN; 118/723 MW; 156/345; 438/729
[58] Field of Search .................. 118/723 E, 723 MR; 156/345; 438/729; 315/507; 200/144 B

[56] References Cited

U.S. PATENT DOCUMENTS

| | | | |
|---|---|---|---|
| 3,889,081 | 6/1975 | Hunstad | 200/144 B |
| 3,935,406 | 1/1976 | Murano et al. | 200/144 B |
| 3,946,179 | 3/1976 | Murano et al. | 200/144 B |
| 4,367,382 | 1/1983 | Suzuki et al. | 200/144 B |
| 5,279,669 | 1/1994 | Lee | 118/723 MR |
| 5,733,405 | 3/1998 | Taki et al. | 156/345 |
| 5,821,705 | 10/1998 | Caporaso et al. | 315/507 |
| 5,846,885 | 12/1998 | Kamata et al. | 438/729 |
| 5,904,780 | 5/1999 | Tomoyasu | 118/723 AN |

FOREIGN PATENT DOCUMENTS 1-279752  11/1989  Japan ......................................... 14/34

Primary Examiner—Thi Dang
Assistant Examiner—Rudy Zervigon
Attorney, Agent, or Firm—Oblon, Spivak, McClelland, Maier & Neustadt, P.C.

[57] ABSTRACT

An inductively coupled type dry etching apparatus has an RF antenna disposed on a dielectric wall forming the ceiling of a process chamber. The process chamber is divided into a plasma generating space and a processing space by the partition of an intermediate electrode. A susceptor is arranged in the processing space, for mounting a semiconductor wafer thereon. The partition has openings for the plasma generating space and the processing space to communicate with each other. The partition is formed of a plurality of conductive beams radially arranged. The conductive beams extend in directions perpendicular to the direction of an electric field generated by the RF antenna, and have warps to absorb thermal stress.

20 Claims, 3 Drawing Sheets

PLASMA PROCESSING APPARATUS

BACKGROUND OF THE INVENTION

1. Field of the Invention

The present invention relates to an apparatus for subjecting a target object to a plasma process in a semiconductor processing system by using a plasma and, more particularly, to an inductively coupled type dry etching apparatus whose process chamber is divided into a plasma generating space and a processing space by an intermediate electrode. Note that semiconductor processing means various types of processing operations performed to manufacture, on a target object, e.g., a semiconductor wafer or an LCD substrate, semiconductor devices and structures including wiring layers and electrodes to be connected to the semiconductor devices by forming semiconductor layers, insulating layers, conductive layers, and the like on the target object with predetermined patterns.

2. Discussion of the Background

As a plasma processing apparatus used in semiconductor processing systems, there is an inductively coupled type dry etching apparatus. This dry etching apparatus generally has a process chamber with a ceiling of a dielectric wall, on which an annular or spiral RF (radio-frequency) antenna is disposed. Further, there is an apparatus of this type having a triode structure, in which the interior of its airtight process chamber is divided into a plasma generating space and a processing space by an intermediate electrode, such as grid. In the etching apparatus having the triode structure, a process is performed as follows.

First, a target object is placed on a lower electrode arranged in the processing space. Subsequently, the process chamber is exhausted by an exhaust system connected to the processing space, thereby setting the entire interior of the process chamber to a predetermined pressure-reduced atmosphere. While the process chamber is continuously exhausted, a process gas is supplied from a process gas supply system to the plasma generating space.

In this state, a plasma generating RF power is applied to the RF antenna so that the process gas supplied to the plasma generating space is excited and dissociated, thereby generating a high-density plasma.

Simultaneously, a bias RF power is applied to the lower electrode to guide, through the intermediate electrode, an etchant in the plasma onto the surface of the wafer arranged in the processing space. Only a desired etchant in the plasma is introduced into the processing space by the intermediate electrode arranged as described above between the plasma generating space and the processing space, thereby etching the wafer.

The plasma is influenced by the pressure in the process chamber, the RF power applied to the antenna, and the like. For example, the plasma diffuses more in the process chamber when the pressure in the process chamber is lower or the RF power applied to the antenna is larger. On the other hand, the plasma stays closer to the RF antenna when the pressure is higher or the RF power is smaller. Further, planar uniformity of the process on the wafer varies, depending on the mixture ratio of the process gas.

As described above, where the intermediate electrode is arranged in the process chamber to divide it into the plasma generating space and the processing space, a ground surface can be provided to face the wafer. With this arrangement, even if the plasma varies due to fluctuation of various conditions, its influence on the wafer can be minimized.

However, in the inductively coupled type dry etching apparatus having the triode structure, there are drawbacks in that the intermediate electrode is overheated and deformed, and some of the input energy from the antenna is wasted. Where the intermediate electrode is deformed, the distance between the wafer and the intermediate electrode becomes less uniform, thereby lowering planar uniformity of the process on the wafer. Further, where the intermediate electrode is deformed or damaged, the wafer may be also damaged or the interior of the process chamber may be contaminated. Where some of the input energy from the antenna is wasted, the process efficiency is decreased.

BRIEF SUMMARY OF THE INVENTION

It is an object of the present invention to provided a plasma processing apparatus which prevents its intermediate electrode from being overheated.

It is another object of the present invention to provided a plasma processing apparatus which prevents its input energy from being wasted.

According to the present invention, there is provided an apparatus for subjecting a target object to a plasma processing by using a plasma, comprising: an airtight process chamber; an intermediate electrode having a conductive partition which divides the process chamber into a plasma generating space and a processing space, and has an opening for allowing the plasma generating space and the processing space to communicate with each other; a potential applying mechanism electrically connected to the intermediate electrode, for applying an electric potential to the intermediate electrode; a support member arranged in the processing space, for supporting the target object in the processing space; a gas supply system for supplying a process gas into the plasma generating space; an exhaust system for exhausting and setting the process chamber at a vacuum; and an electric field generator for generating an electric field for exciting the process gas in the plasma generating space to convert the process gas into a plasma.

In a first aspect of the present invention, the electric field has an electric field direction which is defined essentially by lines of electric force concentrically surrounding a center of the electric field. The partition consists essentially of a plurality of conductive beams extending in directions substantially perpendicular to the electric field direction.

In a second aspect of the present invention, the electric field generator comprises an RF antenna facing the plasma generating space through a dielectric wall and a power supply for supplying an RF power to the RF antenna. The electric field has an electric field direction which is defined essentially by lines of electric force extending substantially parallel to the target object supported by the support member. The partition consists essentially of a plurality of conductive beams extending in directions substantially perpendicular to the electric field direction and parallel to the target object supported by the support member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention, in which.

DETAILED DESCRIPTION OF THE INVENTION

Figure 1:
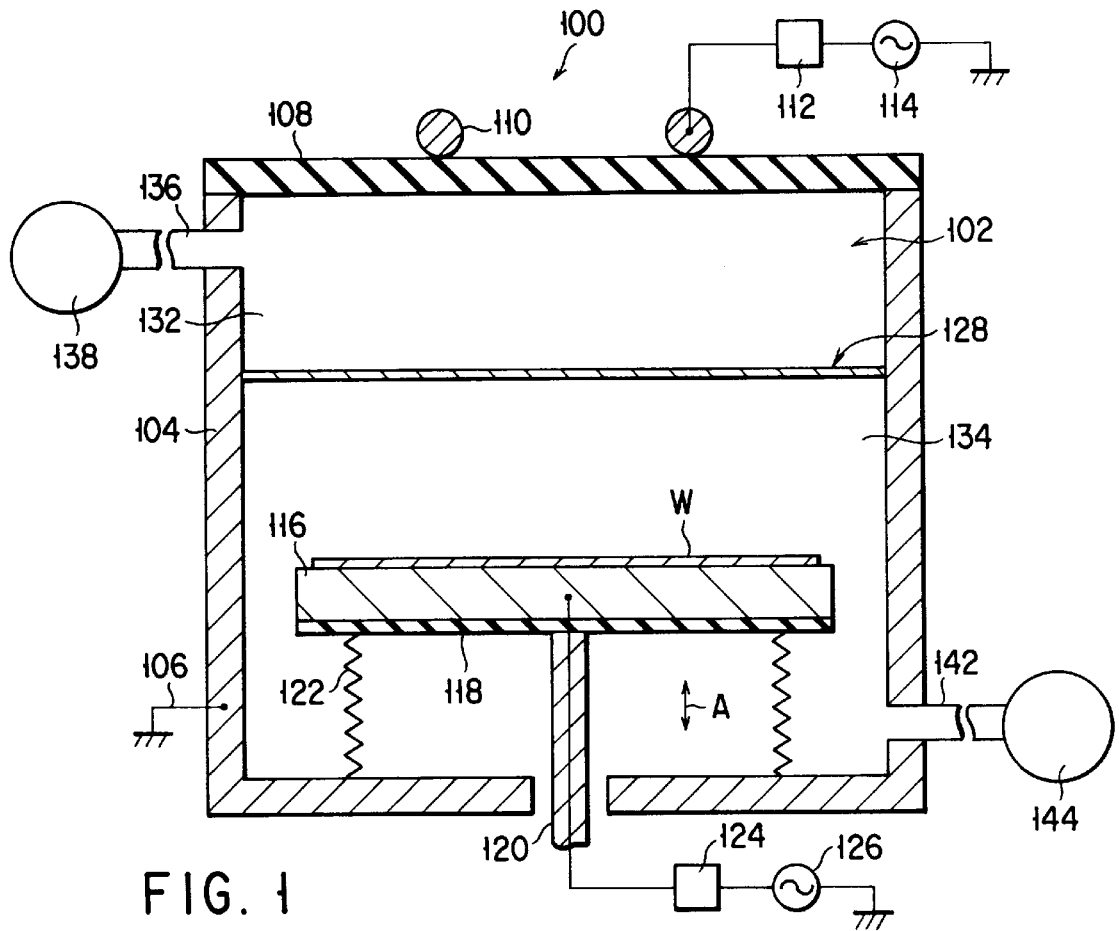
FIG. 1 is a schematic diagram showing an etching apparatus according to an embodiment of the present invention.

Prior to developing the present invention, the present inventor conducted various experiments in an inductively coupled type dry etching apparatus having a triode structure, whose process chamber was divided into a plasma generating space and a processing space by an intermediate electrode. Through the experiments, the present inventor obtained the following findings.

The overheating of the intermediate electrode and loss of input energy in an apparatus of this type are caused by an inductive current flowing through the intermediate electrode. For example, a mesh-like intermediate electrode is used for an annular RF antenna, a current passageway is formed in the intermediate electrode to extend in a direction almost the same as that of an electric field induced by the RF antenna. Consequently, an inductive electric current flows in this current passageway and causes inductive heating. At this time, some of the input energy from the RF antenna is wasted.

The embodiments of the present invention that are made on the basis of these findings will be described hereinafter with reference to the accompanying drawings. In the following description, the constituent elements having substantially the same function and arrangement are denoted by the same reference numerals, and a repetitive description will be made only when necessary.

FIG. 1 is a schematic diagram showing an inductively coupled type dry etching apparatus 100 according to an embodiment of the present invention.

Figure 2:
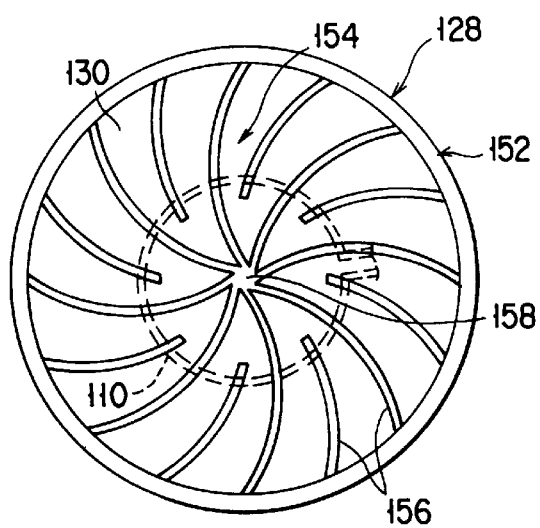
FIG. 2 is a plan view showing an intermediate electrode used in the apparatus shown in FIG. 1.

A process chamber 102 of the etching apparatus 100 is formed in a substantially cylindrical airtight process vessel 104 made of a conductive material. The process vessel 104 itself is grounded through a ground line 106. The ceiling of the process chamber 102 is formed of a dielectric wall 108 made of a dielectric material. A substantially annular RF (radio-frequency) antenna 110, as shown in FIG. 2, is arranged on the dielectric wall 108. The RF antenna 110 is connected, through a matching unit 112, to a first RF power supply 114 which can output a plasma generating RF power, such as an RF power of 13.56 MHz. The RF antenna 110 may be formed spiral.

A susceptor 116 made of a conductive material and forming a lower electrode is arranged in the lower portion of the process chamber 102. A semiconductor wafer W is placed on the work surface of the susceptor 116. An elevating shaft 120 is mounted on the susceptor 116 through an insulating member 118 arranged on the bottom surface portion of the susceptor 116. The elevating shaft 120 is connected to an elevating mechanism (not shown). Accordingly, upon operation of the elevating mechanism, the susceptor 116 can be vertically moved (in the direction of the double-headed arrow A in FIG. 1) through the elevating shaft 120. A bellows 122 made of an airtight member is mounted on the insulating member 118 around the elevating shaft 120 and the bottom surface of the process chamber 102 to extend between them. Hence, even if the susceptor 116 is moved vertically, the airtightness in the process chamber 102 is not impaired. The susceptor 116 is connected, through a matching unit 124, to a second RF power supply 126 that can output a bias RF power, such as an RF power of 380 kHz.

A circular intermediate electrode 128 is arranged between the susceptor 116 and the dielectric wall 108 in the process chamber 102. With the intermediate electrode 128, a plasma generating space 132 is formed on the dielectric wall 108 side and a processing space 134 is formed on the susceptor 116 side in the process chamber 102. The plasma generating space 132 and the processing space 134 communicate with each other only through openings 130 of the intermediate electrode 128. The mounting position of the intermediate electrode 128 is set in accordance with the state of the plasma to be generated in the process chamber 102 and the processing conditions of the wafer W. The distance between the intermediate electrode 128 and the wafer W placed on the susceptor 116 can be adjusted as needed by vertically moving the susceptor 116. The intermediate electrode 128 will be explained later in detail.

The plasma generating space 132 is connected to a gas supply line 136 of a process gas supply system. The gas supply line 136 is connected to a gas source unit 138 through an opening/closing valve and a flow control valve (not shown). The gas source unit 138 has gas sources of a plurality of different gases to be supplied to the process chamber 102, e.g., $CF_4$, $C_4F_8$, CO, $O_2$, Ar, and $N_2$.

The processing space 134 is connected to an exhaust line 142 of the exhaust system. The exhaust line 142 is connected to an exhaust pump 144 through an opening/closing valve and a flow control valve (not shown). The exhaust pump 144 can exhaust the process chamber 102 and set the process chamber 102 at a vacuum of, e.g., from 10 mTorr to 100 mTorr.

As shown in FIG. 2, the intermediate electrode 128 has a conductive outer frame 152 formed of a circular ring, and a conductive partition 154 supported within the outer frame 152. The outer frame 152 and the partition 154 are made of, e.g., aluminum having an anodic-oxidized surface, or other conductive or semi-conductive materials, such as silicon. The intermediate electrode 128 is attached to the process vessel 104, i.e., the conductive side wall of the process chamber 102, by the outer frame 152.

The partition 154 divides the interior of the process chamber 102 into the plasma generating space 132 and processing space 134. The partition 154 is electrically grounded through the outer frame 152, the process vessel 104, and the ground line 106. The portions of the outer frame 152 and the process vessel 104 which are in contact with each other are partly conductive, so that they are electrically connected. The partition 154 may be supplied with a predetermined DC (direct current) electric potential from a variable DC power supply, or may be connected to an RF power supply.

The partition 154 is formed of a plurality of conductive beams 156 which are arranged essentially radial and equidistant with the openings 130 therebetween. The center of the radial shape of the conductive beams 156 aligns with the geometric centers of the RF antenna 110 and the wafer W placed on the susceptor 116. The conductive beams 156 extend in directions which are substantially perpendicular to the direction of the inductive electric field generated by the RF antenna 110, and are substantially parallel to the wafer W placed on the susceptor 116.

The RF antenna 110 is formed of a circular ring coil which is arranged to have a geometric center aligning with that of the wafer W placed on the susceptor 116. Consequently, the electric field induced by the RF antenna 110 has an electric field direction which is defined mainly by lines of electric force concentrically surrounding the center. As described above, no electric current passageway should be formed in any direction the same as the electric field direction in order to prevent inductive electric current flowing in the intermediate electrode. Accordingly, the radial arrangement of the conductive beams 156, as shown in FIG. 2, results in a preferable effect.

Further, the distance between the wafer W and the conductive beams 156 should be constant in order to ensure a high planar uniformity of the process on the wafer W. Since the wafer W is horizontally placed on the horizontal surface of the susceptor 116, the conductive beams 156 are also horizontally arranged.

With this arrangement, no electric current passageway for inductive electric current is formed in the conductive beams 156, so that the conductive beams 156 are hardly heated by inductive heating. As a result, the conductive beams 156 are prevented from being bent up and down by inductive heating, and the distance between the intermediate electrode 128 and the target surface of the wafer W is kept constant. Further, since no inductive electric current flows in the conductive beams 156, the input energy from the RF antenna is hardly wasted, so that a high density plasma is generated in the plasma generating space 132.

Further, as shown in FIG. 2, the conductive beams 156 extend from the inner surface of the outer frame 152 toward the center 158 of the radial shape such that they are curved counterclockwise. These curved portions function as warps to absorb stress caused by thermal expansion. Specifically, even if the conductive beams 156 are burdened with heat, not due to inductive heating, but due to a plasma, heat stress is released in a direction in which the conductive beams are curved, i.e., counterclockwise. As a result, the conductive beams 156 are prevented from being bent up and down.

Furthermore, some of the conductive beams 156, e.g., one of every two beams, extend longer than others. Each pair of the longer conductive beams 156 symmetrically arranged relative to the center 158 are connected to each other at the center 158. This arrangement improves the mechanical strength of the intermediate electrode 128.

The inductive magnetic field generated by the RF antenna 110 can enter the process space 134 through the openings 130 formed among the conductive beams 156. The openings 130 also allows ions, radicals, and electrons in the plasma generated in the plasma generating space 132 to be supplied therethrough into the process space 134. In other words, the necessary species in the plasma generated in the plasma generating space 132 can be incident onto the target surface of the wafer W through the intermediate electrode 128.

Figure 3:
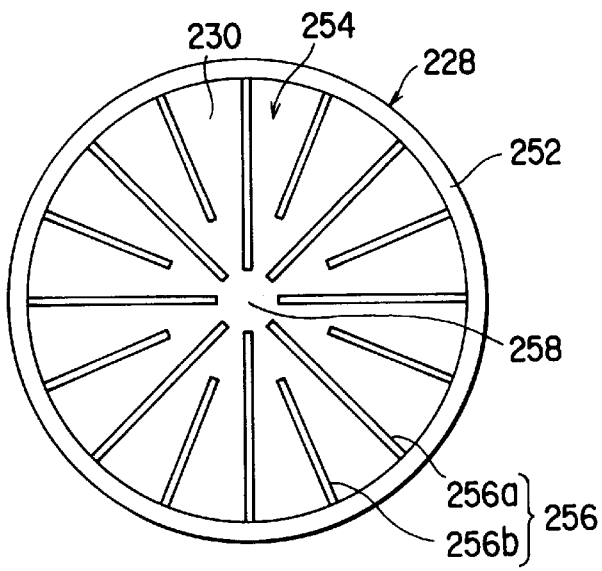
FIG. 3 is a plan view showing a modification of the intermediate electrode.

FIG. 3 is a plan view showing a modification of the intermediate electrode.

As shown in FIG. 3, the intermediate electrode 228 has a conductive outer frame 252 formed of a circular ring, which is almost the same as the outer frame 152, and a conductive partition 254 supported within the outer frame 252. The outer frame 252 and the partition 254 are made of, e.g., aluminum having an anodic-oxidized surface. The intermediate electrode 228 is attached to the process vessel 104, i.e., the conductive side wall of the process chamber 102, by the outer frame 252, at the same position as the intermediate electrode 128.

The partition 254 is formed of a plurality of conductive beams 256 which are arranged essentially radial and equidistant with the openings 230 therebetween. The center of the radial shape of the conductive beams 256 aligns with the geometric centers of the RF antenna 110 and the wafer W placed on the susceptor 116. The conductive beams 256 extend in directions which are substantially perpendicular to the direction of the inductive electric field generated by the RF antenna 110, and are substantially parallel to the wafer W placed on the susceptor 116.

Unlike the conductive beams 156 shown in FIG. 2, however, the conductive beams 256 extend linearly from the inner surface of the outer frame 252 toward the center 258 of the radial shape of the conductive beams 256. The conductive beams 256 consist of longer beams 256a and shorter beams 256b alternately arranged. The beams 256a and 256b are not at all connected at the center 258, but face each other with a gap therebetween.

The intermediate electrode 228 shown in FIG. 3 can prevent itself from being heated by inductive heating, and also prevent the input energy from the RF antenna from being wasted, as in the intermediate electrode 128. Further, since no conductive beams 256 are connected to each other, no inductive current passageway is formed. In addition, even if the conductive beams 256 thermally expand, the intermediate electrode 228 is prevented from being bent up and down.

Figure 4:
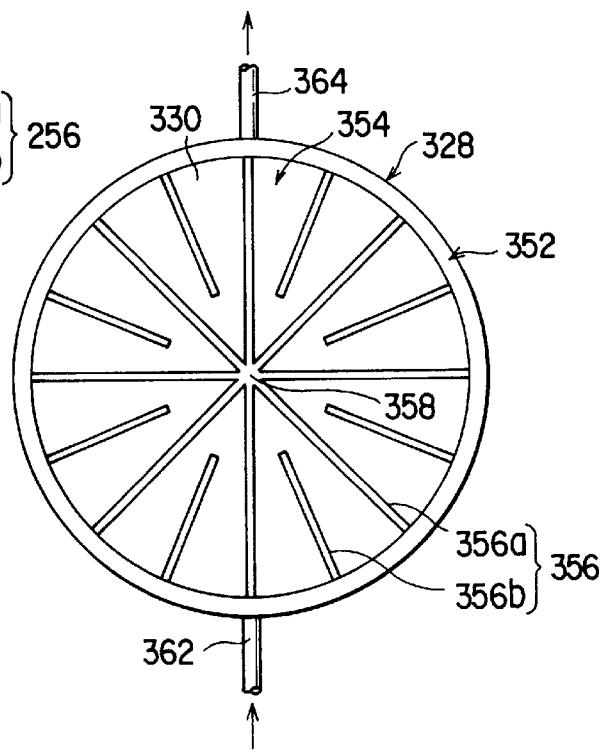
FIG. 4 is a plan view showing another modification of the intermediate electrode.

FIG. 4 is a plan view showing a modification of the intermediate electrode.

As shown in FIG. 4, the intermediate electrode 328 has a conductive outer frame 352 formed of a circular ring, and a conductive partition 354 supported within the outer frame 352. The outer frame 352 and the partition 354 are made of, e.g., aluminum having an anodic-oxidized surface. The intermediate electrode 328 is attached to the process vessel 104, i.e., the conductive side wall of the process chamber 102, by the outer frame 352, at the same position as the intermediate electrode 128.

The partition 354 is formed of a plurality of conductive beams 356 which are arranged essentially radial and equidistant with the openings 330 therebetween. The center of the radial shape of the conductive beams 356 aligns with the geometric centers of the RF antenna 110 and the wafer W placed on the susceptor 116. The conductive beams 356 extend in directions which are substantially perpendicular to the direction of the inductive electric field generated by the RF antenna 110, and are substantially parallel to the wafer W placed on the susceptor 116.

The conductive beams 356 extend linearly from the inner surface of the outer frame 352 toward the center 358 of the radial shape of the conductive beams 356. The conductive beams 356 consist of longer beams 356a and shorter beams 356b alternately arranged. Each pair of longer beams 356a symmetrically arranged relative to the center 358 is connected to each other at the center 358.

Figure 5:
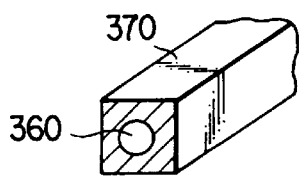
FIG. 5 is a partly cut-out perspective view showing a conductive beam of the intermediate electrode shown in FIG. 4.

As shown in FIG. 5, at least the longer beams 356a are formed of tubes having a circular cross-section in which a coolant circulation passageway 360 is formed. Similarly, the outer frame 352 consists of a tube having a coolant circulation passageway. As shown in FIG. 4, a coolant supply and exhaust lines 362 and 364 are connected to the outer frame 352. The coolant fed from the supply line 362 passes through the coolant circulation passageways in the outer frame 352 and the conductive beams 356a, and then is exhausted from the exhaust line 362.

Figure 6:
FIG. 6 is a partly cut-out perspective view showing a modification of the conductive beam of the intermediate electrode shown in FIG. 4.

Note that conductive beams 370 having a substantially rectangular cross-section, as shown in FIG. 6, can be used instead of the conductive beams 356a. In this case, the conductive beams 356b should have the same cross-section as that of the conductive beams 370.

The intermediate electrode 328 shown in FIG. 4 can prevent itself from being heated by inductive heating, and also prevent the input energy from the RF antenna from being wasted, as in the intermediate electrode 128. Further, since the conductive beams 356a are connected to each other at the center 358, the mechanical strength of the intermediate electrode 328 is improved. Furthermore, since the coolant circulation passageway is formed in the intermediate electrode, the conductive beams 356a are prevented from being overheated by a plasma. For this reason, there is no need to provide the conductive beams 356 with warps for absorbing thermal stress.

Figure 7:
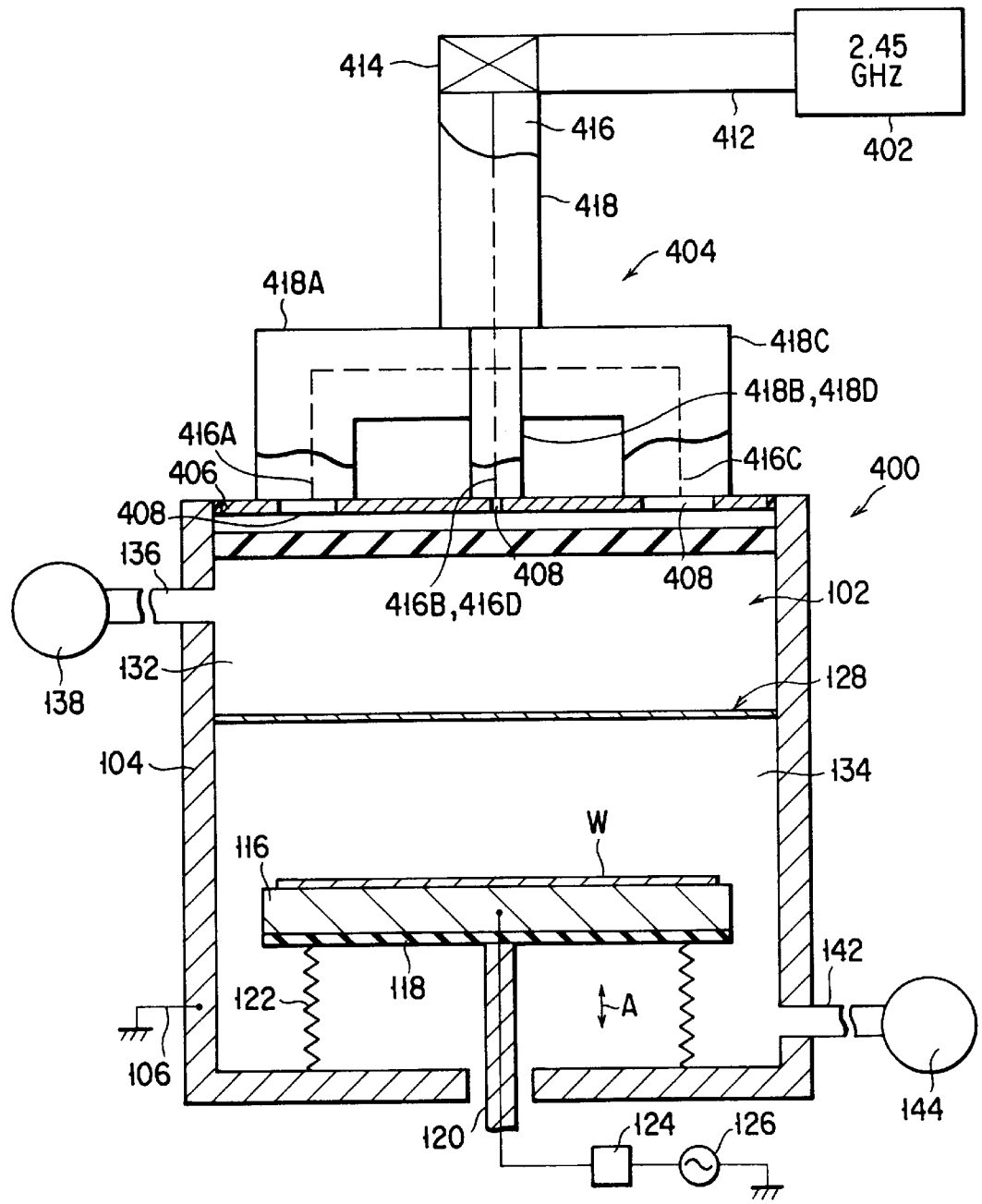
FIG. 7 is a schematic diagram showing an etching apparatus according to another embodiment of the present invention.

FIG. 7 is a schematic diagram showing a dry etching apparatus 400, utilizing the energy of a microwave, according to another embodiment of the present invention.

The embodiment shown in FIGS. 1 to 6 is exemplified by the inductively coupled type dry etching apparatus 100 in which the RF antenna is disposed on the dielectric wall. The present invention is not limited to this embodiment, but may be applied to a plasma processing apparatus which generates a plasma by the energy of a microwave, as shown in FIG. 7. A structure generating a concentric electric field from a microwave is disclosed in co-pending U.S. patent application Ser. No. 08/936,820 filed on Sep. 24, 1997, the teachings of which are hereby incorporated by reference.

The etching apparatus 400 has a basic structure the same as that of the etching apparatus 100 shown in FIG. 1, except for a microwave generator 402 and a wave-guide mechanism 404. The microwave generator 402 generates, e.g., a 2.45-GHz microwave. The wave-guide mechanism 404 is arranged above a dielectric wall 108 of a process chamber 102, for transmitting the microwave from the microwave generator 402. The wave-guide mechanism 404 forms a concentric electric field in a plasma generating space 132, such that the electric field has a center aligning with that of a semiconductor wafer W placed on a susceptor 116. In other words, the electric field has an electric field direction which is defined mainly by lines of electric force concentrically surrounding the center.

Specifically, the wave-guide mechanism 404 has a disk-like flat antenna 406 disposed opposite to and parallel with the dielectric wall 108. The antenna 406 is formed with four slit-like elongated microwave inlets 408 which extend in the radial direction and are arranged concentrically. The microwave generated by the microwave generator 402 is transmitted to the antenna 406 through a rectangular wave-guide 412 made of a conductor and a coaxial wave-guide 418 having a coaxial line 416 in it. The rectangular wave-guide 412 and the coaxial wave-guide 418 are connected to each other through a mode converter 414 made of a conductor to form an angle of 90°.

The coaxial wave-guide 418 is branched into four branched wave-guides 418A to 418D midway. The distal ends of the branched wave-guides 418A to 418D are connected to the four microwave inlets 408 formed in the antenna 406 to cover them. The coaxial line 416 is also branched into four branched coaxial lines 416A to 416D through an impedance matcher. Respective branched coaxial lines 416A to 416D are connected to the antenna 406 through the corresponding branched wave-guides 418A to 418D.

The microwave generated by the microwave generator 410 is transmitted through the rectangular wave-guide 412 in the $TE_{10}$ mode, and is converted into a coaxial mode by the mode converter 414. The microwave which has been transmitted through the coaxial wave-guide 418 is branched into four waves, and the four branched microwaves are transmitted through the branched wave-guides 418A to 418D. Then, the branched microwave is introduced from the microwave inlets 408 into the process chamber 102 through the dielectric wall 108 and forms a concentric electric field similar to the $TE_{01}$-mode field to be parallel to the upper surface of the wafer W.

In the plasma processing apparatus shown in FIG. 7, an electric field is formed in the plasma generating space 132 to have an electric field direction which is defined mainly by concentric lines of electric force. Consequently, the intermediate electrode 128 having the radial-shaped partition shown in FIG. 2, or the intermediate electrode 228 or 328 shown in FIG. 3 or 4 is used, so that the intermediate electrode can prevent itself from being heated by inductive heating, and also prevent the input energy from the RF antenna from being wasted, as in the former embodiment.

Although aluminum having an anodic-oxidized surface is used as the material of the intermediate electrodes in the embodiments shown in FIGS. 1 to 7, another material, such as silicon or stainless steel may be used for the intermediate electrodes. Especially, where a silicon wafer is processed, the intermediate electrodes are made preferably of silicon, thereby preventing the wafer from being contaminated.

Where a processing apparatus employs a plurality of coil RF antennas arranged side by side, a plurality of intermediate electrode portions are arranged side by side to correspond to electric fields formed by the antennas. In this case, each of the intermediate electrode portions is designed to have a characteristic of the present invention, so that the intermediate electrode portions can prevent themselves from being heated by inductive heating, and also prevent the input energy from the RF antenna from being wasted.

The present invention can be applied to a plasma processing apparatus other than an etching apparatus, e.g., an ashing apparatus or a CVD apparatus. The present invention can also be applied to a plasma processing apparatus for a target object other than a semiconductor wafer, e.g., an LCD glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for subjecting a target object to a plasma processing by using a plasma, comprising:

an airtight process chamber;

an intermediate electrode having a conductive partition which divides said process chamber into a plasma generating space and a processing space, and has an opening for allowing said plasma generating space and said processing space to communicate with each other;

a potential applying mechanism electrically connected to said intermediate electrode, for applying an electric potential to said intermediate electrode;

a support member arranged in said processing space, for supporting said target object in said processing space;

a gas supply system for supplying a process gas into said plasma generating space;

an exhaust system for exhausting and setting said process chamber at a vacuum; and an electric field generator for generating an electric field for exciting said process gas in said plasma generating space to convert said process gas into a plasma, said electric field having an electric field direction which is defined essentially by lines of electric force concentrically surrounding a center of said lines of electric force, wherein said partition consists essentially of a plurality of conductive beams extending in directions substantially perpendicular to said electric field direction.

2. The apparatus according to claim 1, wherein said conductive beams are radially arranged relative to a center of said conductive beams substantially aligning with said center of said electric field.

3. The apparatus according to claim 2, wherein some of said conductive beams are connected at said center of said conductive beams.

4. The apparatus according to claim 3, wherein said some of said conductive beams connected at said center of said conductive beams have warps to absorb thermal stress.

5. The apparatus according to claim 2, wherein said conductive beams are arranged to face each other with a gap therebetween at said center of said conductive beams.

6. The apparatus according to claim 2, wherein said center of said conductive beams substantially aligns with a center of said target object.

7. The apparatus according to claim 1, wherein said intermediate electrode further comprises a conductive outer frame supporting said partition.

8. The apparatus according to claim 1, wherein said outer frame of said intermediate electrode is attached to a conductive wall of said process chamber, and said potential applying mechanism includes a ground line electrically connected to said conductive wall of said process chamber.

9. The apparatus according to claim 1, wherein said electric field generator comprises an RF antenna facing said plasma generating space through a dielectric wall and a power supply for supplying an RF power to said RF antenna.

10. The apparatus according to claim 1, wherein said electric field generator comprises a generator for generating a microwave and a wave-guide mechanism for transmitting said microwave to said plasma generating space through a dielectric wall.

11. An apparatus for subjecting a target object to a plasma processing by using a plasma, comprising:

an airtight process chamber;

an intermediate electrode having a conductive partition which divides said process chamber into a plasma generating space and a processing space, and has an opening for allowing said plasma generating space and said processing space to communicate with each other;

a potential applying mechanism electrically connected to said intermediate electrode, for applying an electric potential to said intermediate electrode;

a support member arranged in said processing space, for supporting said target object in said processing space;

a gas supply system for supplying a process gas into said plasma generating space;

an exhaust system for exhausting and setting said process chamber at a vacuum; and an electric field generator for generating an electric field for exciting said process gas in said plasma generating space to convert said process gas into a plasma, said electric field generator comprising an RF antenna facing said plasma generating space through a dielectric wall and a power supply for supplying an RF power to said RF antenna, said electric field having an electric field direction which is defined essentially by lines of electric force extending substantially parallel to said target object supported by said support member, wherein said partition consists essentially of a plurality of conductive beams extending in directions substantially perpendicular to said electric field direction and parallel to said target object supported by said support member.

12. The apparatus according to claim 1, wherein said RF antenna is annular such that said lines of electric force of said electric field are formed to concentrically surround a center of said lines of electric force, and said conductive beams are radially arranged to have a center of said conductive beams substantially aligning with said center of said lines of electric force.

13. The apparatus according to claim 12, wherein some of said conductive beams are connected at said center of said conductive beams.

14. The apparatus according to claim 13, wherein said some of said conductive beams connected at said center of said conductive beams have warps to absorb thermal stress.

15. The apparatus according to claim 12, wherein said conductive beams are arranged to face each other with a gap therebetween at said center of said conductive beams.

16. The apparatus according to claim 12, wherein said center of said conductive beams substantially aligns with a center of said target object.

17. The apparatus according to claim 13, wherein said intermediate electrode further comprises a conductive outer frame supporting said partition.

18. The apparatus according to claim 17, wherein said outer frame of said intermediate electrode is attached to a conductive wall of said process chamber, and said potential applying mechanism includes a ground line electrically connected to said conductive wall of said process chamber.

19. The apparatus according to claim 11, wherein a coolant circulation passageway is formed in said conductive beams.

20. The apparatus according to claim 11, wherein said process gas is a gas for etching said target object.

* * * * *